United States Patent
Miki et al.

(10) Patent No.: US 7,987,406 B2
(45) Date of Patent: Jul. 26, 2011

(54) WIRELESS COMMUNICATIONS APPARATUS AND METHOD

(75) Inventors: Nobuhiko Miki, Yokohama (JP); Kenichi Higuchi, Yokohama (JP); Mamoru Sawahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 290 days.

(21) Appl. No.: 12/438,319

(22) PCT Filed: Aug. 17, 2007

(86) PCT No.: PCT/JP2007/066046
§ 371 (c)(1),
(2), (4) Date: May 19, 2009

(87) PCT Pub. No.: WO2008/023643
PCT Pub. Date: Feb. 28, 2008

(65) Prior Publication Data
US 2009/0249166 A1    Oct. 1, 2009

(30) Foreign Application Priority Data
Aug. 22, 2006    (JP) .................................. 2006-225924

(51) Int. Cl.
*H03M 13/00*    (2006.01)

(52) U.S. Cl. ....................................... 714/762; 714/780

(58) Field of Classification Search .................. 370/535; 375/260; 714/763, 776, 790, 762, 780
See application file for complete search history.

(56) References Cited

U.S. PATENT DOCUMENTS

| | | | | |
|---|---|---|---|---|
| 6,912,684 B2 * | 6/2005 | Miyata et al. | ................. | 714/776 |
| 6,959,019 B2 * | 10/2005 | Roberts et al. | ................. | 370/535 |
| 7,089,480 B2 * | 8/2006 | Yun et al. | ...................... | 714/790 |
| 7,836,376 B2 * | 11/2010 | Berens | .......................... | 714/763 |
| 2010/0020889 A1 * | 1/2010 | Tamaki et al. | ................. | 375/260 |

FOREIGN PATENT DOCUMENTS

| | | |
|---|---|---|
| EP | 1 811 700 A1 | 7/2007 |
| JP | 2000-286722 A | 10/2000 |
| JP | 2003-101504 A | 4/2003 |
| JP | 2004-129249 A | 4/2004 |
| JP | 2004-320434 A | 11/2004 |

(Continued)

OTHER PUBLICATIONS

NTT DoCoMo, Inc., "Link Adaptation Method in Evolved UTRA Uplink," 3GPP TSG-RAN WG1, Nov. 2005, p. 1-6 [retrieved on Sep. 14, 2007]. Retrieved from the Internet<URL:http://www.3gpp.org/ftp/tsg_ran/WG1_RL1/TSGR1_43/Docs/R1-051392.zip> (6 pages).

(Continued)

*Primary Examiner* — David Ton
(74) *Attorney, Agent, or Firm* — Osha • Liang LLP

(57) ABSTRACT

A wireless communications apparatus according to the present invention includes a scheduler which allocates, to a user apparatus, at least one resource block included in a system bandwidth; an interleaver which rearranges an order of bits within a bit sequence according to a specified pattern; a unit which creates a transmit symbol including the interleaved bit sequence; and an interleaving-pattern determining unit which determines a range of the bit sequence to be rearranged based on a number of the resource blocks, a data modulation scheme, and a channel encoding rate, determines a rearranging pattern according to the range, and communicates the determined pattern to the interleaver.

15 Claims, 8 Drawing Sheets

FOREIGN PATENT DOCUMENTS

| | | |
|---|---|---|
| JP | 2006-94005 A | 4/2006 |
| WO | 00/69079 A1 | 11/2000 |
| WO | 2006/054697 A | 5/2006 |

OTHER PUBLICATIONS

Patent Abstracts of Japan, Publication No. 2004-320434, dated Nov. 11, 2004, 1 page.

Patent Abstracts of Japan, Publication No. 2000-286722, dated Oct. 13, 2000, 1 page.

Patent Abstracts of Japan, Publication No. 2003-101504, dated Apr. 4, 2003, 1 page.

Patent Abstracts of Japan, Publication No. 2006-094005, dated Apr. 6, 2006, 1 page.

Patent Abstracts of Japan, Publication No. 2004-129249, dated Apr. 22, 2004, 1 page.

Written Opinion issued in PCT/JP2007/066046, mailed on Oct. 2, 2007 (5 pages).

International Search Report issued in PCT/JP2007/066046, mailed on Oct. 2, 2007, with translation (9 pages).

3GPP TR 25.848 V4.0.0; Mar. 2001 "Physical Layer Aspects of UTRA High Speed Downlink Packet Access" 89 pages.

* cited by examiner (S1) | 1 | 2 | 3 | 4 |

| NUMBER OF RBs | RATE OF INCREASE / DECREASE IN SYSTEMATIC BITS (%) |
|---|---|
| 1 | ±0 |
| 2 | +20, −20 |
| 3 | +20, ±0, −20 |
| ⋮ | ⋮ |

FIG.11

| NUMBER OF RBs | RATE OF INCREASE / DECREASE IN SYSTEMATIC BITS (%) | |
|---|---|---|
| | SMALL CHANNEL FLUCTUATION | LARGE CHANNEL FLUCTUATION |
| 1 | ±0 | ±0 |
| 2 | +20, −20 | +50, −50 |
| 3 | +20, ±0, −20 | +50, ±0, −50 |
| ⋮ | ⋮ | ⋮ |

# WIRELESS COMMUNICATIONS APPARATUS AND METHOD

BACKGROUND OF THE INVENTION

1. Field of the Invention

The present invention generally relates to the technical field of wireless communications, and particularly relates to a wireless communications apparatus and method for use in a wireless communications system for performing frequency scheduling.

2. Description of the Related Art

Error-correction coding and interleaving techniques are often performed in order to increase the reliability of wireless transmission in this type of technical field. The error-correction coding corrects an error based on a correct bit near an erroneously received bit, so that the error-correction capability could decrease when a series of a large number of bits are erroneously received (when a burst error occurs). The interleaving rearranges a bit sequence to be transmitted at both the transmitter and receiver according to some known pattern so as to transmit the bit sequence, with the transmitted bit sequence being rearranged at the receiver so as to reconstruct data. In this way, even when the burst error occurs, the error-correction capability no lower than a certain level may be expected. Such techniques as described above are performed in existing wireless communications systems. HSDPA is disclosed in Non-patent document 1.

Non-patent document 1
3GPP, TR25.848

SUMMARY OF THE INVENTION

Problem(s) to be Solved by the Invention

In future mobile communications systems, allocating at least one of a large number of resource blocks which constitute a system bandwidth to a user apparatus according to a channel condition, etc., to achieve an increased throughput is being considered. Such a technique as described above is called frequency scheduling. When the frequency scheduling is performed, the number of resource blocks (i.e., the frequency bands) used by the user apparatus varies. Moreover, the transmission rate per band also varies according to the data modulation scheme and channel encoding rate, etc. Even in the future mobile communications systems, it is desirable to deal with the burst error as described above. However, it is difficult to apply a related art technique in which the frequency bands and transmission rate are fixed to the future mobile communications systems, in which the frequency bands and transmission rate are not fixed.

The problem to be solved by the present invention is to provide a wireless communications apparatus and method which appropriately perform interleaving and de-interleaving in a wireless communications system in which frequency scheduling is performed.

Means for Solving the Problem

A wireless communications apparatus according to the present invention includes a scheduler for allocating, to a user apparatus, at least one resource block included in a system bandwidth, an interleaver for rearranging the order of bits in a bit sequence, a unit for creating a transmit symbol including the interleaved bit sequence, and an interleaving-pattern determining unit for determining a range of a bit sequence to be rearranged, determining a rearranging pattern based on the determined range, and communicating the determined pattern to the interleaver.

Advantage Of The Invention

The present invention makes it possible to appropriately perform interleaving and de-interleaving in a wireless communications system in which frequency scheduling is performed.

BRIEF DESCRIPTION OF THE DRAWINGS

FIG. 10 is a diagram illustrating a rate of increase/decrease of systematic bits; and FIG. 11 is another diagram illustrating the rate of increase/decrease of the systematic bits.

DESCRIPTION OF THE PREFERRED EMBODIMENTS

Description of Notations

102 channel encoder; 104 interleaver; 106 data modulator; 108 serial/parallel converter (S/P); 110 scheduler; 112 control channel generator; 114 multiplexor; 116 inverse Fourier transformer; 118 guard-interval adding unit; 120 pattern-determining unit; 122 table; 202 guard-interval removing unit; 204 fast Fourier transformer (FFT); 206 separator; 208 control channel reconstructing unit; 210 data demodulator; 212 de-interleaver; 214 channel decoder; 216 pattern-determining unit; 218 table

Best Mode Of Carrying Out The Invention

The present invention has been described by breaking it down into a number of embodiments for the convenience of explanation. However, the breakdown into the embodiments is not essential to the present invention, so that two or more embodiments may be used as required.

Embodiment 1

Figure 1:
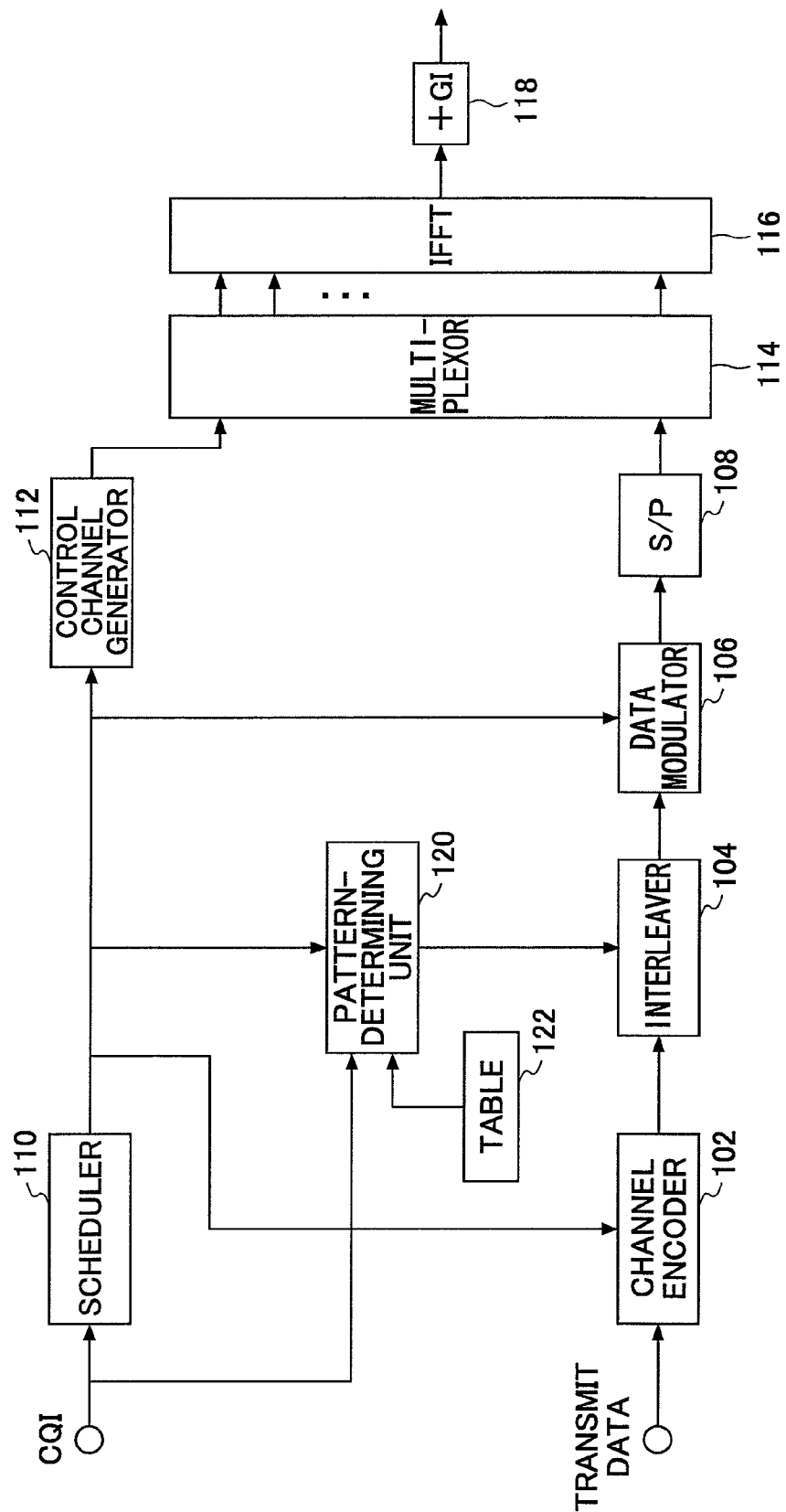
FIG. 1 is a functional block diagram of a transmitter according to an embodiment of the present invention.

FIG. 1 shows a transmitter according to an embodiment of the present invention. While the transmitter is typically provided at a base station of a mobile communications system, it may be provided at another apparatus as in the present embodiment. Moreover, orthogonal frequency division multiplexing (OFDM) is used for downlink in the present embodiment. FIG. 1 shows a channel encoder 102, an interleaver 104, a data modulator 106, a serial/parallel converter (S/P) 108, a scheduler 110, a control channel generator 112, a multiplexor 114, an inverse Fourier transformer (IFFT) 116, a guard-interval adding unit (+GI) 118, a pattern-determining unit 120, and a table 122.

According to scheduling information (a channel encoding rate) from the scheduler 110, the channel encoder 102 encodes a bit sequence representing data to be transmitted. While any appropriate encoding scheme may be applied, it is preferable to use Turbo codes or LDPC (low density parity check codes) from the point of view of obtaining a high error-correcting capability.

According to a selected pattern, the interleaver 104 rearranges the order of bits within the encoded bit sequence. The pattern as described above is determined at the pattern-determining unit 120.

The data modulator 106 modulates data according to scheduling information (a data modulation scheme) from the scheduler 110. Different modulation schemes such as QPSK, 16 QAM, or 64 QAM, etc., may be used. In the present embodiment, the modulation scheme and channel encoding rate are adaptively changed according to the wireless channel state.

The serial/parallel converter (S/P) 108 converts a serial data sequence into multiple parallel sequences.

The scheduler 110 determines how radio resources are allocated to user apparatuses based on various decision criteria. More specifically, it is determined to which user apparatus is allocated at least one resource block (RB) which takes up a predetermined bandwidth of, e.g., 375 kHz, or a unit transmission period (or a transmission interval, TTI: transmission time interval) of, e.g., 0.5 ms; which modulation scheme and what channel encoding rate should be used; what level of transmission power should be used for transmitting; etc. While representative decision criteria include CQIs, an amount indicating the channel state of the downlink that is reported from a user apparatus, and an amount indicating the uplink channel state that is measured at a base station, other decision criteria may be used. For example, fairness among the user apparatuses may be considered with respect to an amount of data waiting to be transmitted in a transmit buffer (an amount held in the buffer) may be considered. The scheduling of the radio resources is performed in both time and frequency directions.

The control channel generator 112 generates a control channel, which includes scheduling information indicating what radio resources planned by the scheduler are allocated. The control channel may include not only a signaling channel used for demodulating a data channel, but also information (ACK, NACK, etc.) which does not have to accompany the data channel.

The multiplexor 114 multiplexes the data channel and the control channel. The multiplexor may be called a mux. The method of multiplexing, typically frequency division multiplexing (FDM), may be used with time division multiplexing (TDM). The FDM may be a localized FDM for dividing the overall range into multiple contiguous bands, or a distributed FDM. With the distributed FDM, individual user apparatus signals are processed such that they have a large number of frequency components lined up in equal intervals in a comb-tooth manner on the frequency axis with the respective user apparatus signal phases adjusted such that the user apparatus signals are mutually orthogonal on the frequency axis.

The inverse fast Fourier transformer (IFFT) 116 inverse Fourier transforms (discrete inverse Fourier transforms) an input signal, performs OFDM modulation, and outputs a transmit symbol.

The guard-interval adding unit (GI+) 118 adds a guard interval to the transmit symbol, and communicates the resultant transmit symbol to a radio transmitter (not shown). In the present embodiment, the guard interval is created with a cyclic prefix (CP) scheme.

Based on scheduling information, the pattern determining unit 120 determines a pattern used for interleaving.

The table 122 stores information regarding the interleaving pattern.

Contrary to a conventional manner, rearranging of a bit sequence that is performed in the interleaver is performed according to a pattern determined according to the scheduling information. This point will be discussed below.

Figure 2:
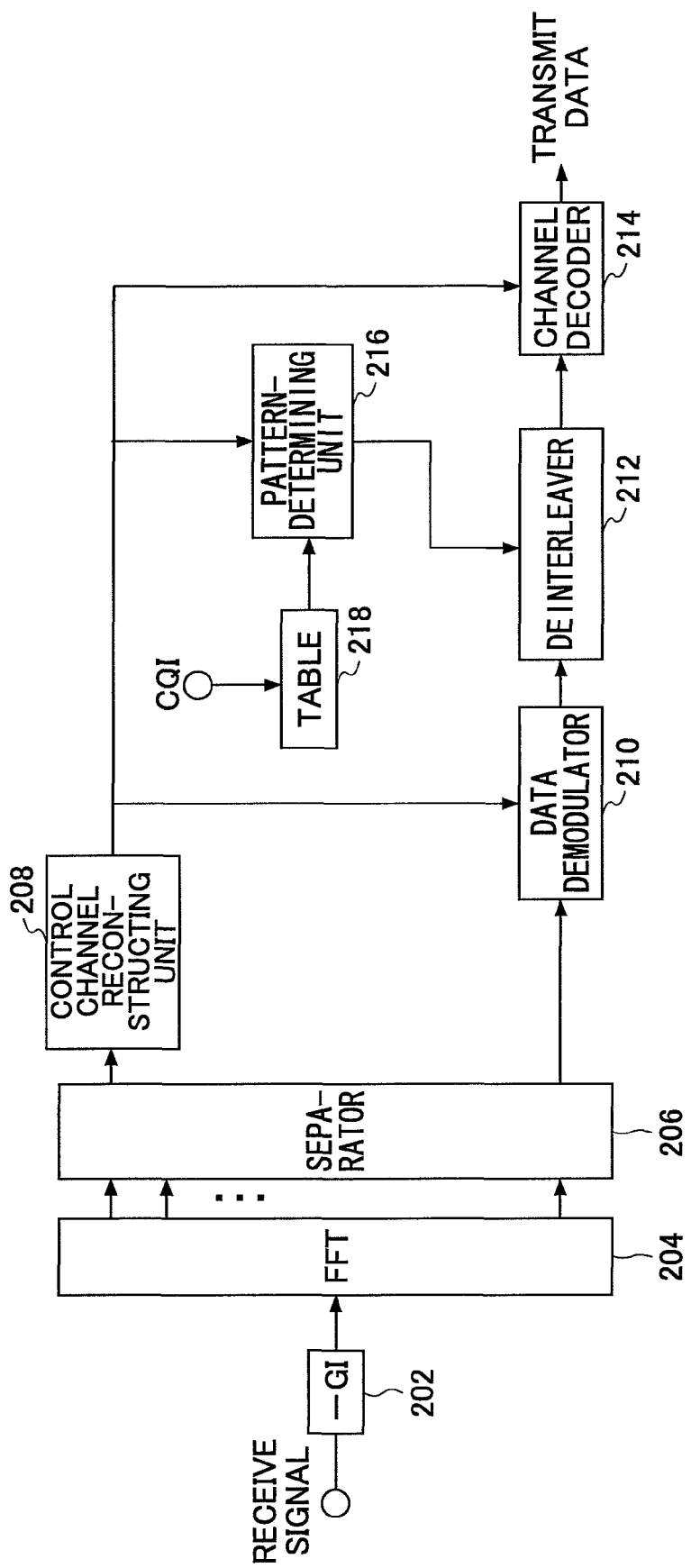
FIG. 2 is a functional block diagram of a receiver according to an embodiment of the present invention.

FIG. 2 shows a receiver according to an embodiment of the present invention. While the receiver is typically provided at a user apparatus, as in the present embodiment, it may be provided at another apparatus. FIG. 2 shows a guard-interval removing unit (−GI) 202, a fast Fourier transformer (FFT) 204, a separator 206, a control channel reconstructing unit 208, a data demodulator 210, a de-interleaver 212, a channel decoder 214, a pattern-determining unit 216, and a table 218.

The guard interval removing unit (−GI) 202 removes a guard interval from a receive signal which is received at a radio receiver (not shown) and converted to baseband.

The fast Fourier transformer (FFT) 204 fast Fourier transforms an input signal, and demodulates the signal using OFDM.

The separator 206 separates a control channel and a data channel from the receive signal. The separator may be called a demultiplexor.

The control channel reconstructing unit 208 demodulates and decodes the control channel and reconstructs various kinds of control information sets. In FIG. 2, the scheduling information is reported to the data modulator 210, the pattern-determining unit 216, and the channel decoder 214.

The data demodulator 210 demodulates data according to the scheduling information.

According to a selected pattern, the de-interleaver 212 rearranges the order of bits within a bit sequence. The pattern as described above is determined at the pattern-determining unit 216.

The channel decoder 214 decodes the bit sequence according to the scheduling information.

Based on the scheduling information, the pattern determining unit 216 determines a pattern used for de-interleaving. The pattern as described above corresponds to what is determined at the transmitter. In other words, the pattern is specified such that the bit sequence rearranged at the de-interleaver 212 becomes a bit sequence prior to interleaving.

The table 218 stores information regarding the interleaving pattern.

Transmit data shown on the left side of FIG. 1 are channel encoded and interleaved according to the scheduling information. Contrary to a conventional manner, rearranging of the bit sequence that is performed with the interleaving is performed according to a pattern determined according to the scheduling information. Subsequently, the transmit data are modulated according to the scheduling information, and multiplexed with the control channel, after which the multiplexed channels are inverse Fourier transformed, generating an effective symbol. In the effective symbol, a guard interval is added, and a transmit symbol is formed, which is wirelessly transmitted. At the receiver, as shown on the left in FIG. 2, the guard interval is removed from the transmit symbol, extracting the effective symbol. The effective symbol is Fourier transformed, separating the control and data channels. The data channel is demodulated according to scheduling information derived from the control channel, de-interleaved, and channel decoded, reconstructing transmit data.

Figure 3:
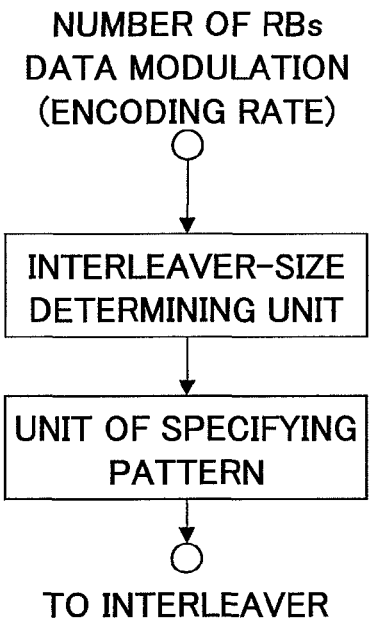
FIG. 3 is a diagram illustrating an exemplary configuration of a pattern-determining unit in FIG. 1.

FIG. 3 shows an exemplary configuration of the pattern-determining unit 120 in FIG. 1. In the illustrated example, the pattern-determining unit has an interleaver-size determining unit and a unit for specifying patterns. Based on the number of resource blocks (RBs), data modulation scheme, and channel encoding rate, the interleaver-size determining unit determines how many bits are to be transmitted at one time (in one packet), thereby determining the number of bits to be interleaved (interleaver size). For brevity of explanation, while the interleaving is described as being performed per bit, it may be performed in any units of information. The interleaver size varies in accordance with the number of resource blocks, data modulation scheme (modulation multinary number), and channel encoding rate. The unit for specifying patterns determines how a bit sequence is rearranged in the determined interleaver size, which is reported to the interleaver 120. Any appropriate pattern may be adopted.

Figure 4:
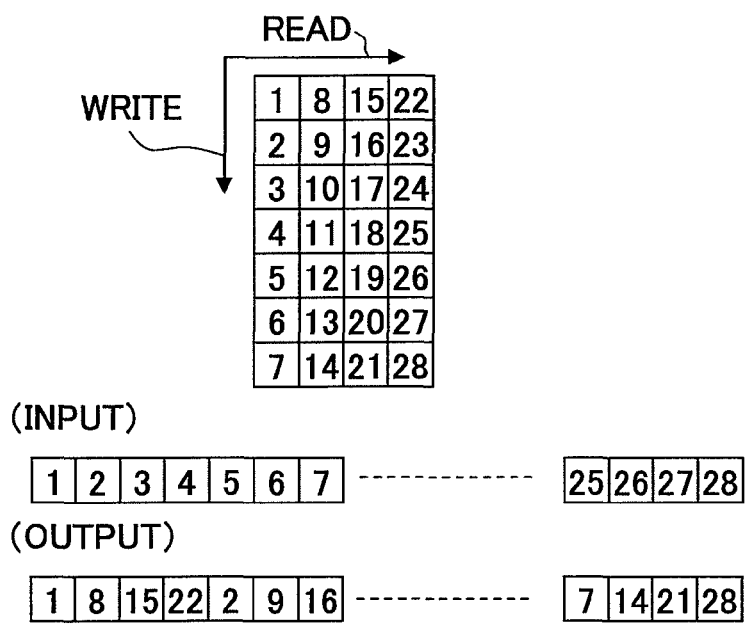
FIG. 4 is a diagram illustrating a pattern example for interleaving.

FIG. 4 shows an exemplary pattern of interleaving. The illustrated scheme may also be called block interleaving. In this scheme, the interleaving is performed such that, in a storage area having a size which is approximately equal to the interleaver size, bits within a bit sequence are sequentially written in the column direction after which completion the bits are read in the row direction. The numbers in the Figure represents bit numbers included in the bit sequence. The writing may be performed in the row direction with the reading in the column direction. While the rearranging scheme itself is known, it significantly differs from conventional schemes in that the interleaver size changes every moment. In other words, while bits numbered 1 to 28 are to be rearranged in the illustrated example, more or less number of bits are possibly to be rearranged in another moment.

Figures 5, 6:
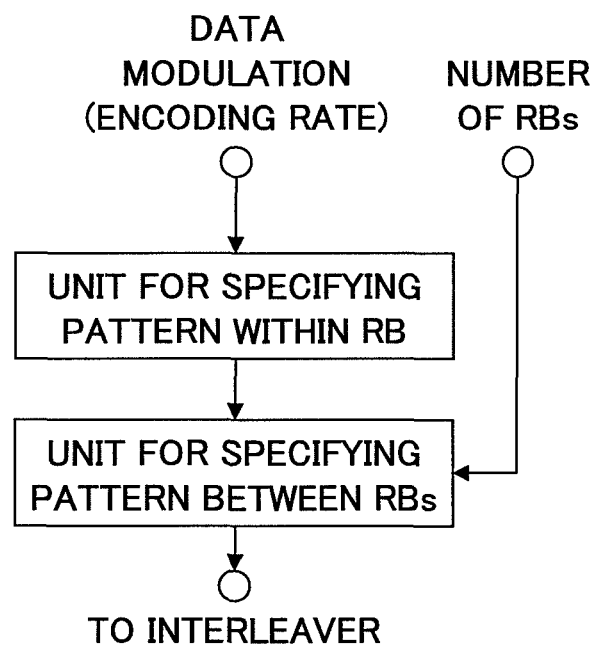
FIG. 5 is a diagram illustrating another pattern example for interleaving.
FIG. 6 is a diagram illustrating another exemplary configuration of a pattern-determining unit in FIG. 1.

FIG. 5 shows another exemplary pattern of the interleaving. In this scheme, a bit sequence to be rearranged is divided into two. For example, as shown in step S1, when a sequence of bits numbered 1 to 4 is rearranged, the bit sequence is divided into a first half and a second half. Then, as shown in step S2, the rearranging is performed such that a first-half bit and a second-half bit line up alternately. More specifically, first and third bits from the left in step S2 are first-half bits, "1" and "2" (the first and second bits), in step S1. The second bit in step S2 is a sum of "1", a first bit in step S2, and "2", an end bit of the first half in step S1, which is "1+2", or "3" (a first bit of the second-half). The fourth bit in step S2 is a sum of "2", a third bit in step S2, and "2", an end-bit of the first half in step S1, which is "2+2", or "4" (a second bit of the second-half). When the interleaver size is 8, the rearranging is performed such that the same procedure is repeated as shown in steps S2 and S3. Similarly, the rearranging to larger bit sequences is performed.

FIG. 6 is a diagram illustrating another exemplary configuration of the pattern-determining unit in FIG. 1. As illustrated, the pattern-determining unit has a unit for specifying patterns within an RB, and a unit for specifying patterns between RBs. The unit for specifying patterns within an RB determines how a bit sequence which can be held in one resource block is rearranged within its size. For convenience of explanation, this pattern is called a first pattern. This corresponds to rearranging within the resource block. The unit for specifying patterns between RBs determines how rearranging is performed inside or outside of resource blocks. For convenience of explanation, this pattern is called a second pattern.

Figure 7:
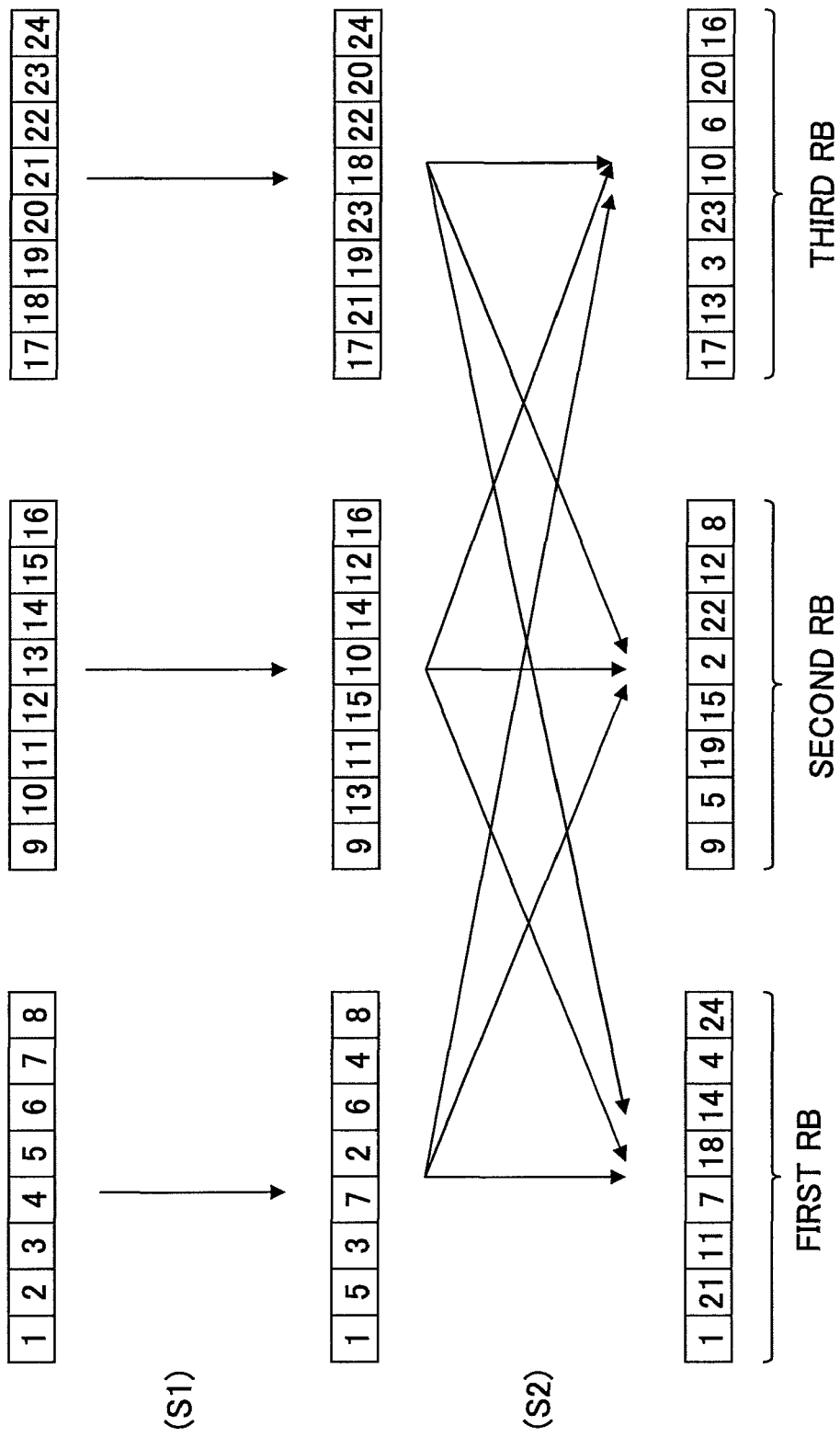
FIG. 7 is a diagram illustrating a pattern example for interleaving.

FIG. 7 shows an exemplary pattern which may be used at the pattern-determining unit in FIG. 6. In the illustrated example, the interleaver size corresponds to 3 resource blocks. First, a first pattern is determined by the unit for specifying patterns within an RB. The patterns explained with respect to FIGS. 4 and 5 may be adopted for the first pattern. In the example in FIG. 7, pattern S3 in FIG. 5 is used as the first pattern. In the example in FIG. 7, eight bits are included in one resource block. As described above, while the interleaving is described as being performed per bit, it may be performed in any units of information. The bit sequences to be interleaved correspond to 3 resource blocks, with the first to 24th bits to be rearranged. As shown in step S1, the respective three sets of 8 bits are rearranged according to the first pattern. A pattern for rearranging the first to eighth bits, a pattern for rearranging the 9th to 16th bits, and a pattern for rearranging the 17th to 24th bits are all equal.

Next, a further rearranging is performed according to the second pattern. In the illustrated example, rearranging between the resource blocks is performed cyclically (using a cyclic-shift scheme). More specifically, 8 bits within the first resource block are cyclically allocated to each of the first, second, and third resource blocks. A position to be allocated is determined according to a position occupied within the first resource block (which slot as counted from the left). For example, "1", "5", "3", "7", "2", "6", "4", and "8", which correspond to the first resource block in step S1, are respectively associated with the first, second, third, first, second, third, first, and second resource blocks in step S2. "1" is associated with (mapped to) the first of the first RB, "5" with (to) the fifth of the second RB, "3" with (to) the third of the third RB, "7" with (to) the fourth of the first RB, "2" with (to) the fifth of the second RB, "6" with (to) the sixth of the third RB, "4" with (to) the seventh of the first RB, and "8" with (to) the eighth of the second RB. The same applies to bits 9-24.

While the interleaving may be performed according to only the first pattern or the second pattern, it is preferable to utilize both the first and second patterns from the point of view of spreading a series of codewords (encoded bits) as much as possible in the time and frequency domains and enhancing the interleaving effect. Moreover, from the point of view of facilitating a derivation of patterns having a greater interleaving effect, it is preferable to make proper use between a pattern within the RB and a pattern between the RBs.

Regardless of the patterns determined at the pattern-determining unit 120, information indicating the determined patterns is reported to the interleaver 104 and the receiver. The information indicating the patterns may be represented in any appropriate scheme. For example, bit positions before and after the rearranging may be represented directly, or they may be represented by means of pattern numbers which specify what are selected from patterns provided in advance.

Embodiment 2

Preferably, data to be transmitted are channel encoded for error correction, and Turbo codes or LPDC codes are used from a point of view of enhancing the error-correcting capability. When such encoding as described above is performed, the encoder outputs two sequences of systematic and parity bits. The parity bits may be referred to as redundant bits.

On the other hand, when multiple resource blocks are allocated to a user apparatus, a channel state in one resource block may end up better than a channel state in another resource block.

Figure 8:
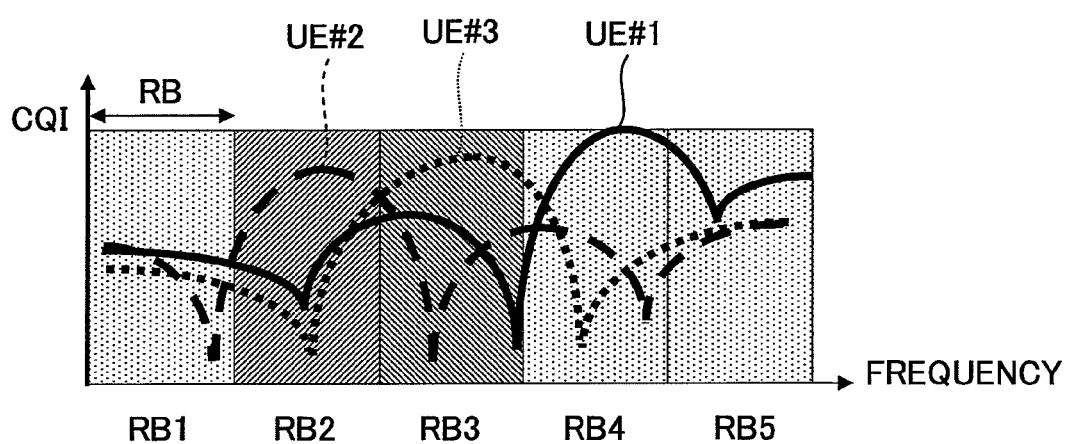
FIG. 8 is a schematic drawing illustrating a channel condition of a user apparatus.

FIG. 8 schematically illustrates channel states of user apparatuses (UEs) 1, 2, and 3. The illustrated example shows how, according to the level of CQI, resource blocks RB1, RB4 and RB5 are allocated to the user apparatus 1, a resource block RB2 to the user apparatus 2, and a resource block RB3 to the user apparatus 3. With respect to the user apparatus 1, three resource blocks are allocated. In general, the channel states are not the same. In the illustrated example, the channel state descends in the order of RB4, RB5, and RB1. In this case, it is preferable to transmit a larger number of systematic bits in a region with a better channel state. Preferably, more systematic bits are transmitted in the RB4. Embodiment 2 of the present invention deals with such preference.

Figure 9:
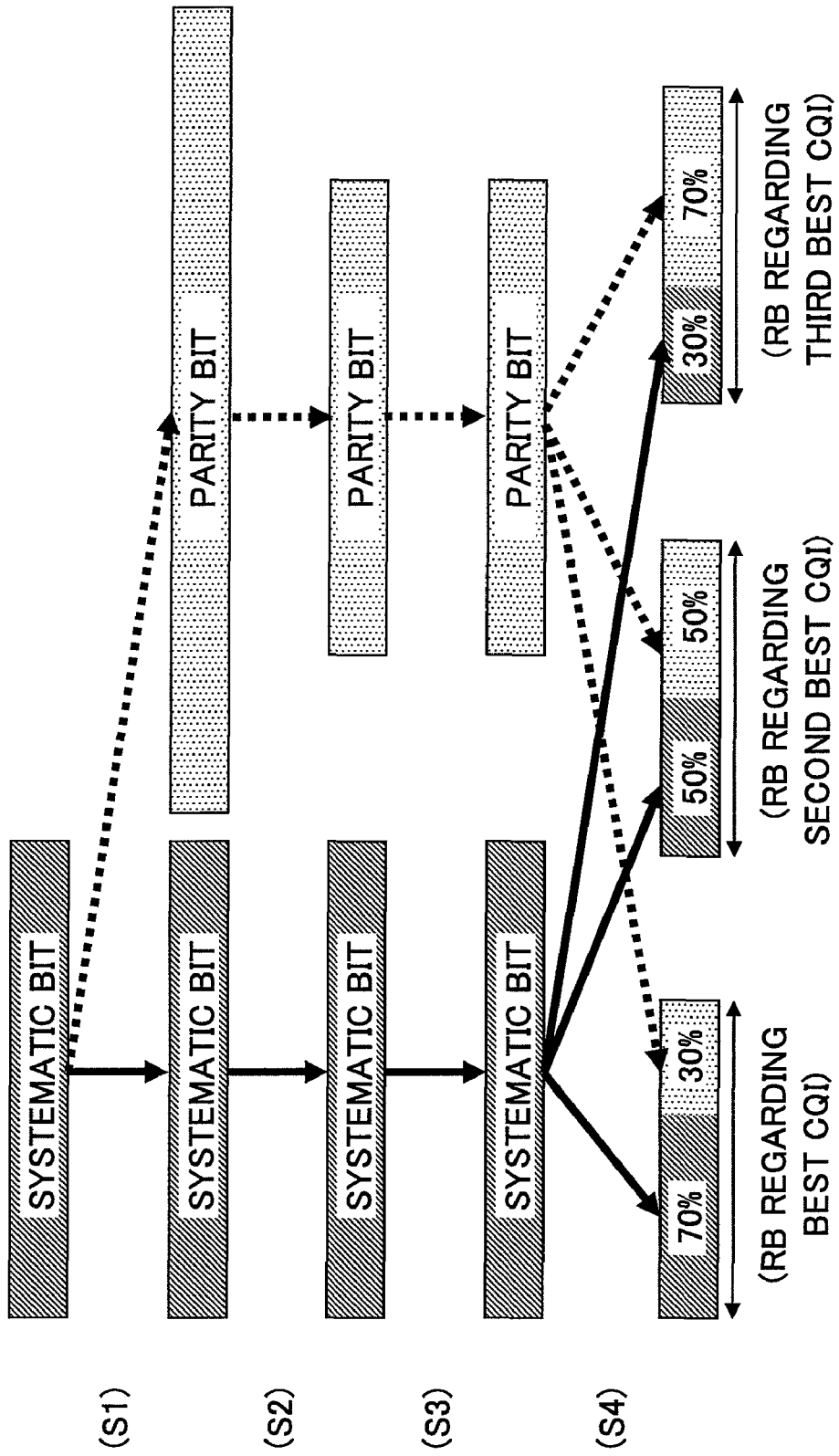
FIG. 9 is a diagram illustrating an interleaving procedure used in Embodiment 2 of the present invention.

FIG. 9 shows a procedure for interleaving according to the present embodiment. In step S1, a bit sequence to be transmitted (an input bit sequence) is input to an encoder, outputting systematic and parity bits. The systematic bits are the same as the input bit sequence.

In step S2, a rate matching is performed, removing some of the parity bits. The rate matching may be performed at the channel encoder (102 in FIG. 1), at the interleaver (104 in FIG. 1), or at a different functional unit.

In step S3, the systematic as well as parity bits are interleaved. In the present example, the systematic and parity bits are interleaved separately. The interleaving pattern may be any appropriate pattern. For convenience of explanation, this interleaving is called a first interleaving.

In step S4, the systematic bits are allocated to resource blocks. In this case, the allocations are performed such that more of the systematic bits are transmitted in a better channel state. For convenience of explanation, this allocating is called a second interleaving. For example, three resource blocks RB4, RB5 and RB1 are allocated to a certain user apparatus, where, with respect to the user apparatus, the channel state is the best in RB4, the second best in RB5, and the third best (the worst of all) in RB 1. In this case, more systematic bits are transmitted in RB4. For example, bit allocations are performed such that +20% of bits transmitted in RB4, 0% of bits transmitted in RB5, and −20% of bits transmitted in RB1 are the systematic bits. The number of resource blocks and the percentage occupied by the systematic bits may be determined in advance. For convenience of explanation, while an increase/decrease in percentages with reference to 50% has been described, a different percentage becomes a reference for the encoding rate other than ½. For example, when the encoding rate R=¾, the reference for the increase/decrease in percentages is set to be a reference with 75% representing the systematic bits and 25% representing the parity bits.)

FIG. 10 shows a table format of percentages set in advance. In the illustrated example, the encoding rate is ½ with the original percentages of the systematic and parity bits being 50%, where for the number of resource blocks of 1, the percentages are determined such that the systematic bits take up 50%. For the number of resource blocks of 2, 70% of the systematic bits are set to be transmitted at a best-channel state resource block, with 30% at a second best-channel state resource block. For the number of resource blocks of 3, 70% of the systematic bits are transmitted at the best-channel state resource block, with 50% at the second best-channel state resource block, and 30% at a third best-channel state resource block. Such information as described above is stored in the table 122 in FIG. 1 and the table 218 in FIG. 2. The pattern-determining unit 120 obtains the number of resource blocks from the scheduling information, the percentage of the systematic bits from the table 122, and the channel state per resource block from the CQI, and reports, to the interleaver 104, as to in which resource blocks the systematic bits should be included and to what extent, as well as the first interleaving pattern.

Now, when multiple resource blocks are allocated to a user apparatus, channel states with respect to each resource block may differ significantly or may not differ so significantly. Moreover, for a user apparatus moving at high speed, the relative instantaneous channel state may not be so important (this is because it is likely that the channel state will vary for scheduling and for transmitting.) Thus, when the channel state significantly varies from one resource block to another, it is preferable for more of the systematic bits to be transmitted in a better resource block. However, when the channel state does not vary so significantly from one resource block to another, or for the user moving at high speed, it is preferable that the systematic bits be uniformly contained in all resource blocks. From such viewpoint as described above, as illustrated in FIG. 11, the percentage of the systematic bits within the resource block may be selected according to the amount of change of the channel state from one resource block to another (or according to a different decision criterion such as the mobility of the user apparatus). For example, if three resource blocks are allocated to a user apparatus, when the channel variation among the three resource blocks is relatively small, it is set such that 70% of the systematic bits is transmitted at a best-channel state RB, with 50% at a second best-channel state resource block, and 30% at a third best-channel state resource block. On the other hand, when the channel variation among the three resource blocks is relatively large, it is set such that 100% of the systematic bits is transmitted at a best-channel state RB, with 50% at a second best-channel state resource block.

Numerical values shown in FIGS. 10 and 11 are merely examples, so that any appropriate numerical value may be used. Moreover, while only two choices are shown for the systematic bit percentage in accordance with the magnitude of the channel variation, additional choices may be provided.

In the present embodiment, such information on the percentage of the systematic bits is also transmitted to the user apparatus in the control channel. The user apparatus specifies and de-interleaves information indicating the first interleaving pattern and information indicating the percentage of the systematic bits from the control channel. The user apparatus periodically measures the channel state per resource block, reports, to the base station, the measured values, based on which scheduling is performed. Thus, the user apparatus should know the degree of the channel state of the resource block allocated to itself. As the relationship between the number of resource blocks and the percentage of the systematic bits as shown in FIGS. 10 and 11 is known, it may not be mandatory to include a CQI (or information indicating how good the resource block is) which is referred to in scheduling. However, from a point of view of increasing the reliability of the receive signal at the user apparatus, it is preferable to include such CQI as described above in a downlink control channel. If a table as shown in FIG. 11 is referred to, when the base station erroneously determines the magnitude of the channel variation, the user apparatus may not be able to demodulate the receive signal. When the CQI is reported from the base station, the user apparatus can correctly obtain the percentage of systematic bits within each resource block even in a case of the erroneous determination as described above.

As described above, while the present invention is described with reference to specific embodiments, the respective embodiments are merely exemplary, so that a skilled person will understand variations, modifications, alternatives, and replacements. While specific numerical value examples are used to facilitate understanding of the present invention, such numerical values are merely examples, so that any appropriate value may be used. Breakdown to the respective embodiments is not essential to the present invention, so that two or more embodiments may be used as needed. For convenience of explanation, while the apparatus according to the embodiments of the present invention is explained using functional block diagrams, such apparatus as described above may be implemented in hardware, software, or a combination thereof. The present invention is not limited to the above embodiments, so that variations, modifications, alternatives, and replacements are included in the present invention without departing from the spirit of the present invention.

The present application claims priority based on Japanese Patent Application No. 2006-225924 filed on Aug. 22, 2006 with the Japanese Patent Office, the entire contents of which are hereby incorporated herein by reference.

The invention claimed is:

1. A wireless communications apparatus, comprising:
    a scheduler which allocates, to a user apparatus, at least one resource block included in a system bandwidth;
    an interleaver which rearranges an order of bits within a bit sequence according to a specified pattern;
    a unit which creates a transmit symbol including the interleaved bit sequence; and
    an interleaving-pattern determining unit which determines a range of the bit sequence to be rearranged based on a number of the resource blocks, a data modulation scheme, and a channel encoding rate, determines a rearranging pattern according to the range, and communicates the determined pattern to the interleaver.

2. The wireless communications apparatus as claimed in claim 1, wherein the interleaver rearranges by block interleaving.

3. The wireless communications apparatus as claimed in claim 1, wherein the bit sequence to be rearranged is divided into two, and interleaving is performed such that a bit belonging to a first half and a bit belonging to a second half alternately line up.

4. The wireless communications apparatus as claimed in claim 1, wherein the interleaving-pattern determining unit determines a first pattern according to which a bit sequence which can be held in one resource block is rearranged, and a second pattern according to which a bit sequence which can be held in at least two resource blocks is rearranged.

5. The wireless communications apparatus as claimed in claim 1, further including
    a channel-encoding unit which channel encodes the bit sequence and outputs systematic bits and parity bits.

6. The wireless communications apparatus as claimed in claim 5, further including
    a table which determines percentages of the systematic bits and parity bits included in the resource block.

7. The wireless communications apparatus as claimed in claim 6, wherein the percentages are determined such that more of the systematic bits are included in the resource block with a better channel state.

8. The wireless communications apparatus as claimed in claim 6, wherein
    the percentages of the systematic bits and parity bits are set equal for the multiple resource blocks.

9. The wireless communications apparatus as claimed in claim 6, wherein the percentages are determined per the number of the resource blocks allocated to the user apparatus.

10. The wireless communications apparatus as claimed in claim 9, wherein a multiple number of the percentages are provided in a table for each of the number of the resource blocks.

11. The wireless communications apparatus as claimed in claim 6, wherein information indicating the pattern determined at the interleaving-pattern determining unit is included in the transmit symbol.

12. The wireless communications apparatus as claimed in claim 11, wherein information indicating the percentages is also included in the transmit symbol.

13. A method of wireless communications, comprising the steps of:
    allocating, to a user apparatus, at least one resource block included in a system bandwidth;
    determining a range of a bit sequence to be rearranged based on a number of resource blocks, a data modulation scheme, and a channel encoding rate and determining a rearranging pattern according to the range;
    interleaving by rearranging an order of bits within the bit sequence according to the determined pattern; and
    creating and transmitting a transmit symbol including the interleaved bit sequence.

14. A wireless communications apparatus, wherein,
    in a base station, a range of a bit sequence to be rearranged is determined based on a number of resource blocks, interleaving is performed by rearranging an order of bits within the bit sequence according to a rearranging pattern according to the range, and a transmit symbol including the interleaved bit sequence is transmitted, the wireless communications apparatus, comprising:
    a unit which receives a signal including the interleaved bit sequence and control information in at least one allocated resource block included in a system bandwidth;
    a de-interleaver which rearranges an order of the bits within the received bit sequence according to a pattern reported in the control information; and
    a unit which reconstructs a transmit signal from the de-interleaved bit sequence.

15. A method of wireless communications, wherein,
    in a base station, a range of a bit sequence to be rearranged is determined based on a number of resource blocks, interleaving is performed by rearranging an order of bits within the bit sequence according to a rearranging pattern according to the range, and a transmit symbol including the interleaved bit sequence is transmitted, the method comprising:
    the step of receiving a signal including the interleaved bit sequence and control information in at least one allocated resource block included in a system bandwidth;
    the step of de-interleaving which rearranges an order of the bits within the received bit sequence according to a pattern reported in the control information; and
    the step of reconstructing a transmit signal from the de-interleaved bit sequence.

* * * * *